United States Patent [19]

Kao

[11] Patent Number: 6,137,106
[45] Date of Patent: Oct. 24, 2000

[54] CONTACT IMAGE SENSOR MODULE HAVING SPRING MOUNTINGS

[75] Inventor: Will Kao, Hsinchu, Taiwan

[73] Assignee: Mustek Systems Inc., Hsinchu, Taiwan

[21] Appl. No.: 09/281,832

[22] Filed: Mar. 30, 1999

[51] Int. Cl.[7] .............................. H01J 5/02; H01L 27/00; H04N 1/04
[52] U.S. Cl. ..................... 250/239; 250/208.1; 358/483
[58] Field of Search .................................. 250/208.1, 239; 358/482, 483; 257/291

[56] References Cited

U.S. PATENT DOCUMENTS 5,900,951 5/1999 Tsai ............................................ 358/497
6,008,485 12/1999 Chiang ................................. 250/208.1
6,072,602 6/2000 Sun et al. ................................. 358/483

*Primary Examiner*—Scott J. Sugarman
*Attorney, Agent, or Firm*—Christensen O'Connor Johnson Kindness PLLC

[57] ABSTRACT

A contact image sensor module having a plurality of spring mountings is provided to allow the CIS module contact tightly with the bottom surface side of the sheet table. The spring mountings are made of spring steel so that they are soft and elastic enough to support the CIS module. The spring mountings are engaged to the CIS module in a manner that ear-shaped spring steel plates are formed to rest on the side walls of the carriage for absorbing the shock of the CIS module. When conveyed by a carriage, the present invention can be adapted to any flatbed scanner having either a single guiding device or a pair of guiding device.

8 Claims, 7 Drawing Sheets

CONTACT IMAGE SENSOR MODULE HAVING SPRING MOUNTINGS

BACKGROUND OF THE INVENTION

A. Field of the Invention

The present invention relates to a contact image sensor module (hereinafter referred to as CIS module), especially to a CIS module having spring mountings at both ends thereof. The improved structure of the CIS module can assure a document sheet in focus, thereby to improve the picture quality of images.

B. Description of the Prior Art

The scene depth of a conventional contact image sensor is only about 0.3 mm. Any manufacture error or structure distortion will easily shift the document sheet away from the focus. To keep the document sheet staying within such short scene depth, the conventional carriage 2 contains an internal spring 4 at the bottom of the carriage as shown in FIG. 1. The function of the internal spring 4 is to lift the contact image sensor module 1 up to contact the bottom surface side of the sheet table 6. Refer to FIG. 1, a contact image sensor module 1 is loaded in a fitting carriage 2. When the carriage 2 is supported by a guiding device 3, the CIS module 1 can contact tightly with the bottom surface side of the sheet table 6 with sliding blocks 5a, 5b interposed therebetween while being driven by the guiding device 3. With the spring 4, the CIS module 1 can contact tightly with the bottom surface side of the sheet table 6 to keep the document sheet in focus even if the housing is distorted. However, for the concern of convenience in assembly, the conventional structure as illustrated in FIG. 1 still has a few drawbacks. For instance, the spring 4 must be located precisely and firmly at the bottom center of the carriage 2. In addition, the guiding device 3 must be carefully installed to keep the carriage 2 in balance. It would be desirable to simplify the structure of the conventional CIS module and make the assembly easier.

SUMMARY OF THE INVENTION

The primary object of the present invention is to apply two sets of spring mountings engaged to each end of the CIS module for supporting the CIS module to contact tightly with the bottom surface side of the sheet table, thereby to keep the document sheet within the scene depth of the CIS module.

Accordingly, the present invention provides a contact image sensor module having two sets of spring mountings for supporting the CIS module to contact tightly with the bottom surface side of the sheet table. The invention mainly includes two sets of spring mountings engaged to each end of the CIS module in a manner that an ear-shaped spring steel plate is formed to rest in the slots of the carriage. The spring mountings are made of spring steel plate so that they are elastic and soft. Consequently, the spring mountings can absorb the shock of the CIS module while being driven along the sheet table. Additionally, the sliding elements may be attached on top of the spring mountings for reducing the friction between the sheet table and the spring mountings. Moreover, when conveyed by a carriage, the present invention can be adapted to any flatbed scanner having either a single guiding device or a pair of guiding device. With the simplified structure, the assembly of the CIS module would be much easier.

BRIEF DESCRIPTION OF THE DRAWINGS

These and other objects and advantages of the present invention will become apparent by reference to the following description and accompanying drawings wherein.

DETAILED DESCRIPTION OF THE PREFERRED EMBODIMENTS

Figure 1:
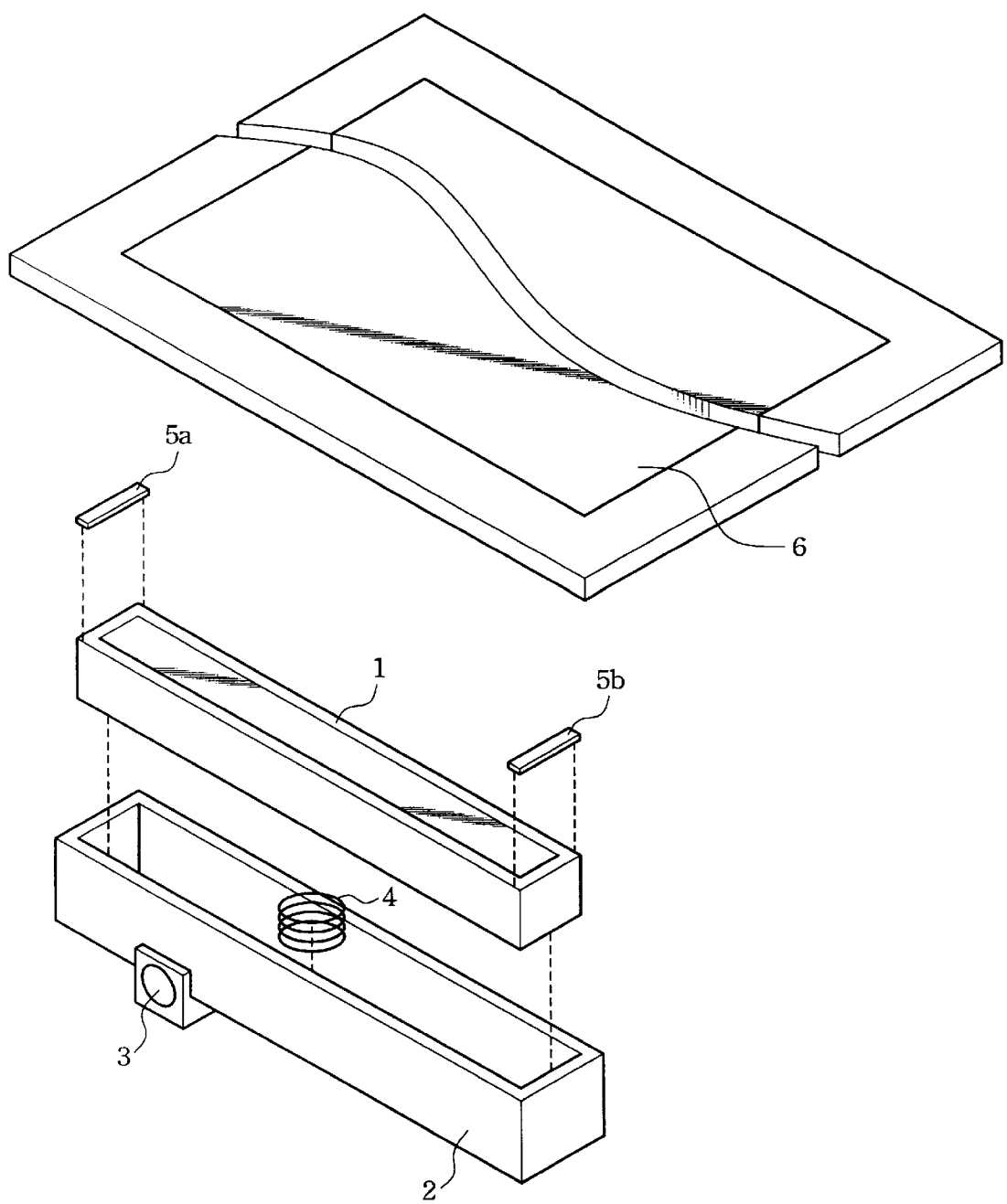
FIG. 1 is a top view schematically showing the structure of a conventional CIS module.
Figure 2A:
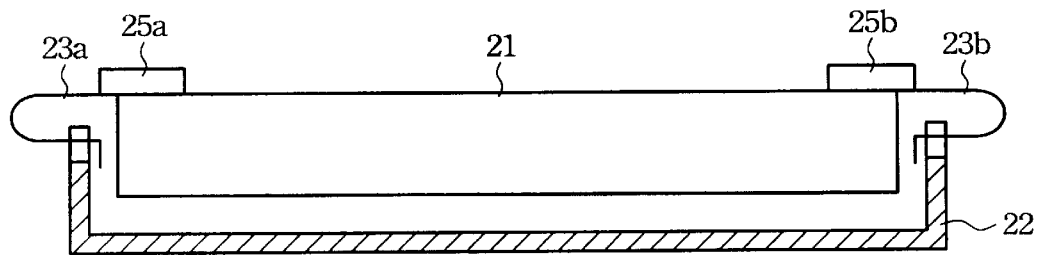
FIG. 2A is a perspective side view schematically showing the structure of the contact image sensor module having spring mountings according to the preferred embodiment of the present invention.
Figure 2B:
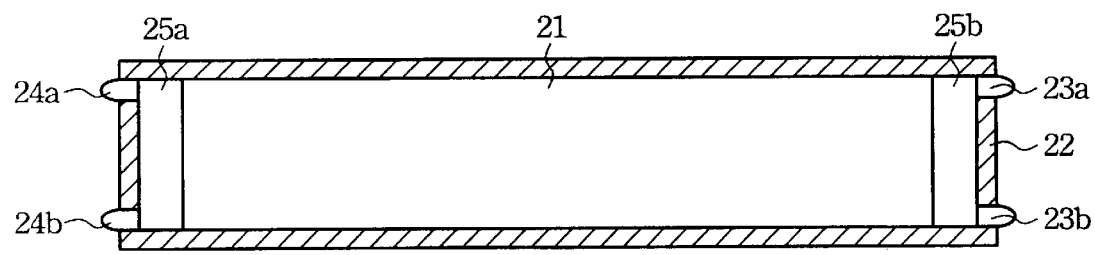
FIG. 2B is a top view schematically showing the structure of the contact image sensor module having spring mountings according to the preferred embodiment of the present invention.

Accordingly, the preferred embodiment of the present invention is illustrated in FIG. 2A. The CIS module 21 is bar-shaped. A set of spring mountings 23a, 23b are engaged to the end of the CIS module 21. The spring mountings 23a, 23b are made of spring steel so that they are very elastic. The spring mountings 23a, 23b are engaged to the CIS module 21 in a manner that one end of the spring mounting is fixed to the CIS module 21 and ear-shaped spring steel plates 23a, 23b are formed to rest in the slots of the side walls of the carriage 22. The relative positions of the spring mountings 23a, 23b and the carriage 22 can be illustrated more clearly from FIG. 2B. Refer to FIG. 2B, on both ends of the CIS module 21, there are two sets of spring mountings 23a, 23b, 24a, 24b rested in the slots of the carriage 22. Since the spring mountings 23a, 23b, 24a, 24b are made of spring steel, so the surface of the spring mountings 23a, 23b, 24a, 24b are very smooth and elastic. The friction between the spring mountings 23a, 23b, 24a, 24b and the sheet table 27 can be reduced to the minimum.

Figure 2C:
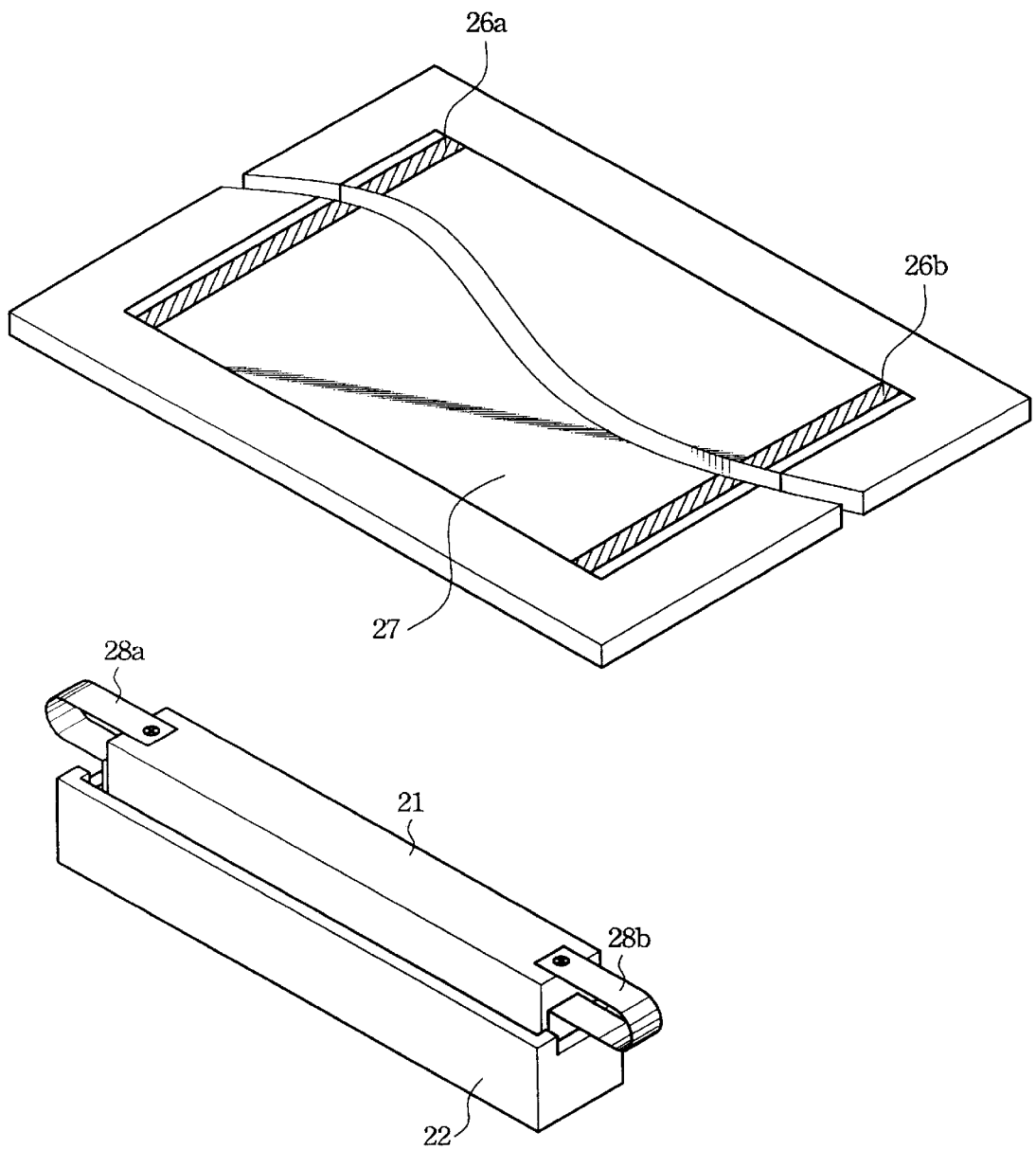
FIG. 2C is a perspective side view showing the present invention when applied to a sheet table having two long sliding elements.
Figure 2D:
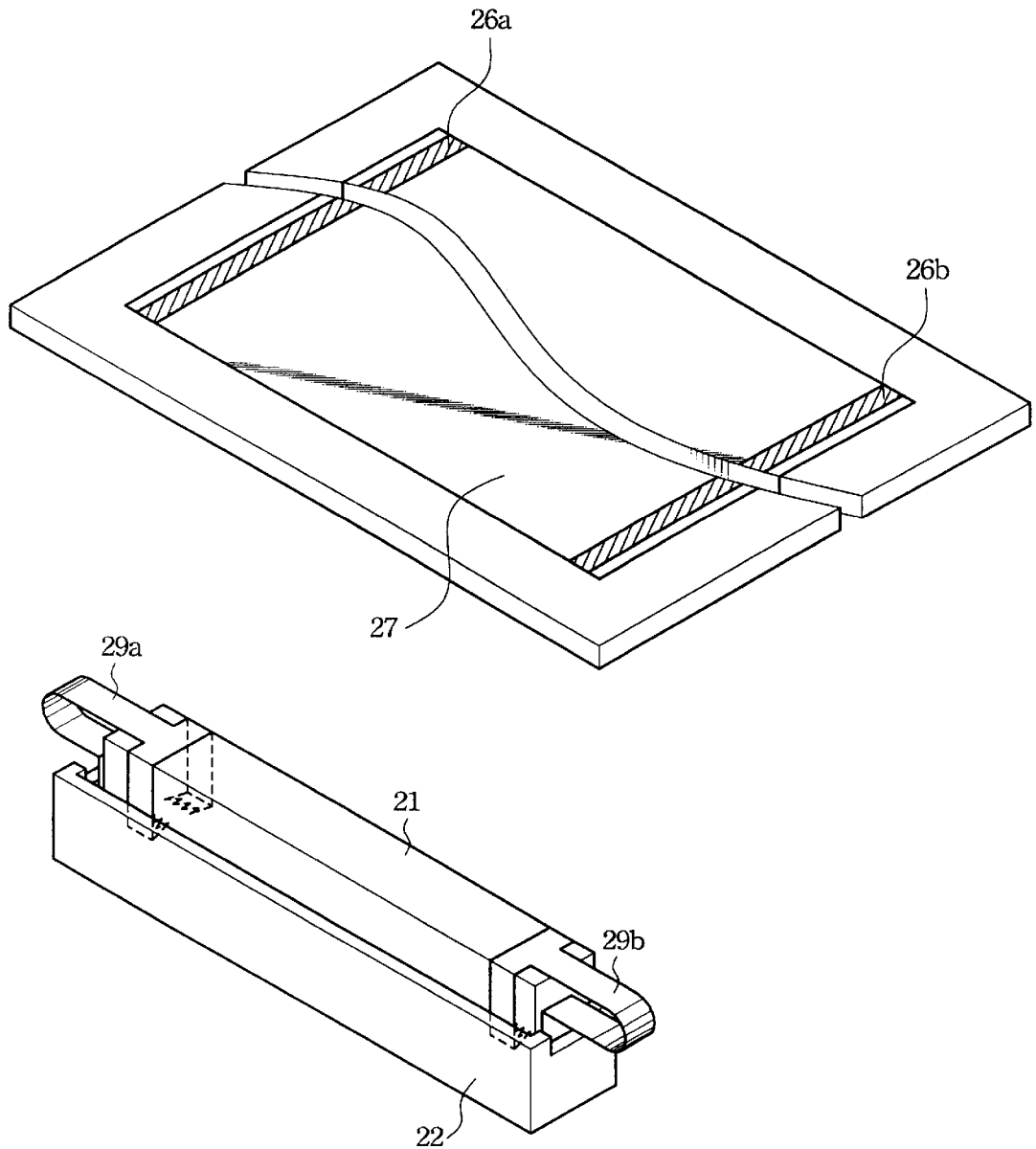
FIG. 2D is a side view showing the structure of another embodiment of the spring mountings.

The ear-shaped spring mountings 23a, 23b can adjust the vertical vibration of the CIS module 21. However, to further reduce the friction between the sheet table 27 (Refer to FIG. 2C) and the CIS module 21, there are some possible implementations. For instance, sliding elements 25a, 25b, such as spacers or sliding blocks, can be attached on top of the spring mountings 23a, 23b, 24a, 24b. Moreover, the sliding elements 26a, 26b can also be attached on the two longitudinal sides of the sheet table 27 correspondent to the two ends of the CIS module 21 as illustrated in FIG. 2C. Refer to FIG. 2C, the number of spring mountings 28a, 28b have been reduced to two because each of the spring mountings 28a, 28b has been made larger and with more elasticity. The structure of the spring mountings 28a, 28b can also be improved with the structure as shown in FIG. 2D. The spring mounting 29 has a horseshoe-shaped holder for holding the CIS module 21 and an ear-shaped spring steel plate. The ends of the horseshoe-shaped holder are teeth-shaped so to hold the CIS module 21 more firmly. Thus, with the support of the spring mountings as illustrated in FIGS. 2A–2D, the CIS module 21 can be driven smoothly along the sheet table 27 while still contact tightly with the bottom surface side of the sheet table.

Figure 3A:
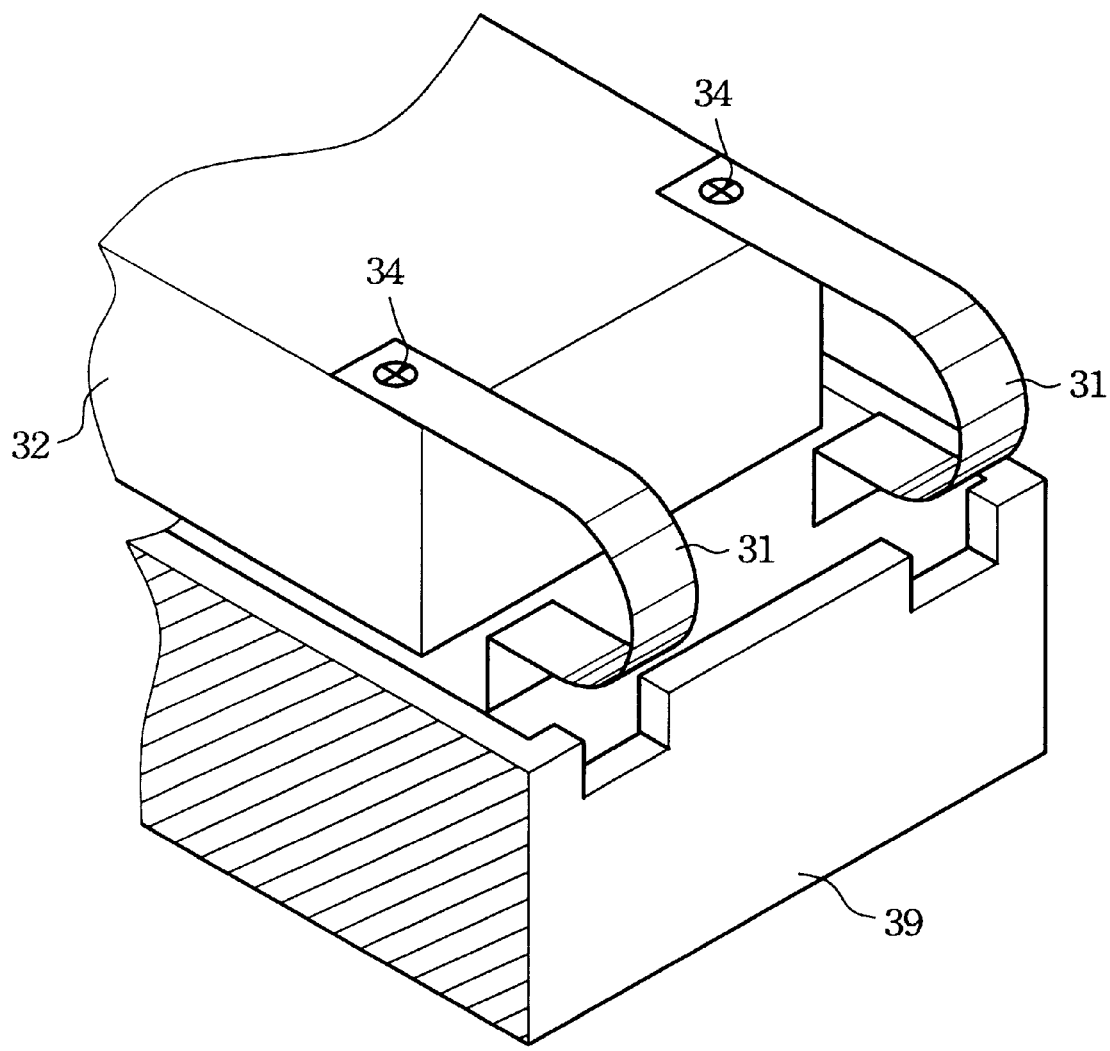
FIGS. 3A and 3B are enlarged partial views showing the parts where the spring mounting is engaged to the CIS module.
Figure 3B:
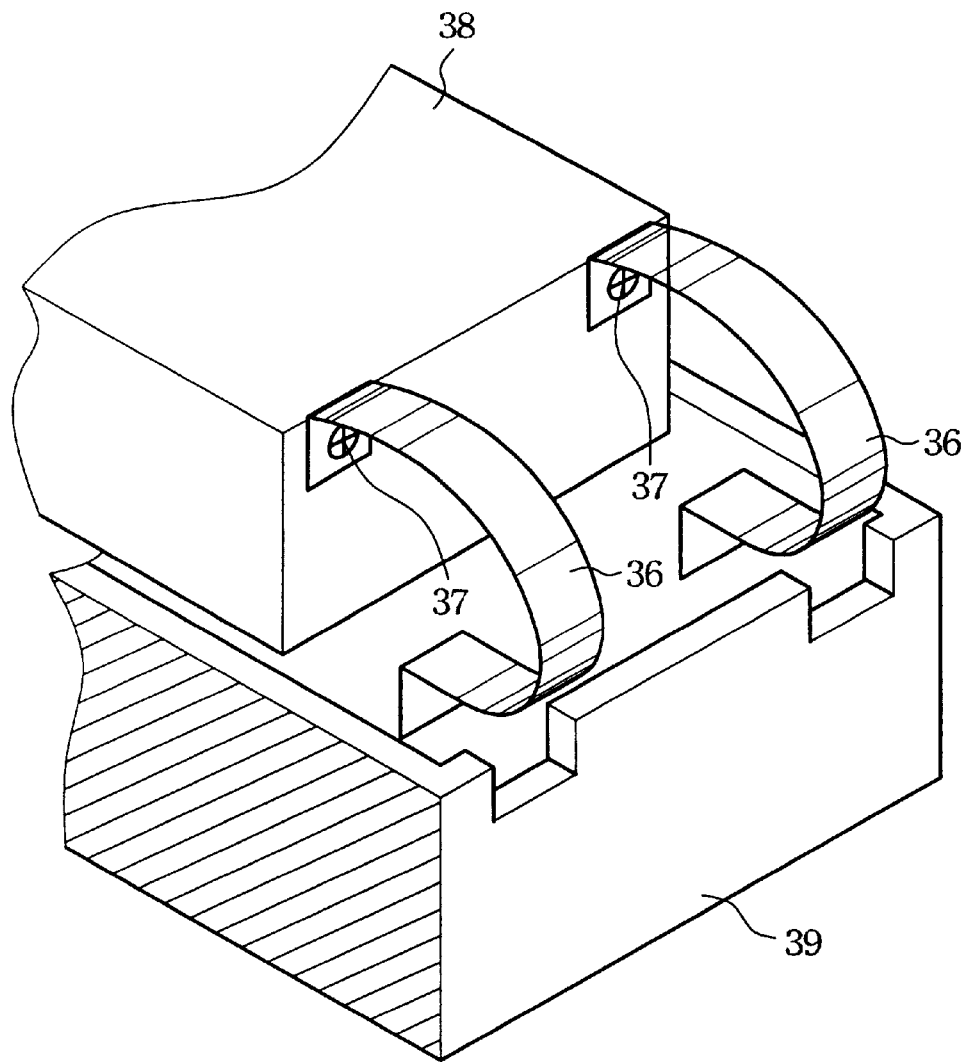

The spring mountings can be engaged to the CIS module in many possible ways. Refer to FIG. 3A, one end of the spring mounting 31 is fixed on top of the CIS module 32 with a screw. An ear-shaped spring steel plate 31 is then formed to rest in the slot of the carriage 33. Refer to FIG. 3B for another example. One end of the spring mounting 36 is fixed on the side wall of the CIS module 38 with a screw 37. An ear-shaped spring steel plate 36 is then formed to rest in the slot of the side wall of the carriage 39. There are still many possible ways to engage the spring mountings to the CIS module. The object is simply to form ear-shaped spring steel plates so that they can absorb the shock of the CIS module while being driven along the sheet table.

Figure 4:
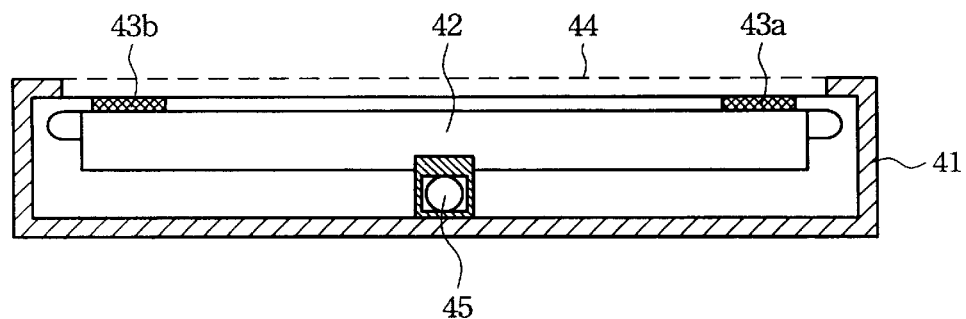
FIG. 4 is a perspective side view showing the inventive CIS module is applied to a flatbed scanner of a single guiding device.

The present invention allows the CIS module adaptable to scanners of various driving and guiding structures. A preferred embodiment of the present invention is illustrated in FIG. 4. Refer to FIG. 4 for showing the preferred embodiment of the present invention when adapting to a flatbed scanner with a single guiding device. On top of the housing 41, there is a sheet table 44 for placing a document sheet. A carriage 42 containing a contact image sensor is located beneath the sheet table and supported by a single guiding device 45. The single guiding device 45 may be a shaft crossing over the bottom center of the carriage 42 for supporting the carriage 42 to contact the bottom surface side of the sheet table 44. Two sliding elements 43a, 43b, such as sliding blocks, are attached onto the top surface of the spring mountings 46a, 46b. When the carriage 44 is driven along the guiding device 45, the spring mountings 46a, 46b help to reduce the vertical vibration of the contact image sensor. The sliding elements 43a, 43b also help to reduce the friction between the sheet table 44 and the spring mountings 46a, 46b. The driving device (not shown) can be implemented on one side of the guiding device 45 to pull the carriage 42 from one end of the sheet table 44 to the other end of the sheet table 44 to progressively finish reading of the document.

Figure 5:
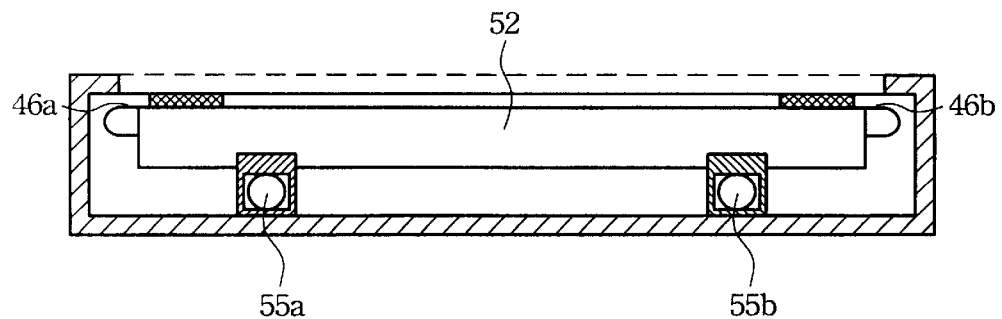
FIG. 5 is a perspective side view showing the inventive CIS module is applied to a flatbed scanner of two parallel guiding devices.

The preferred embodiment of the present invention is also adaptable to a flatbed scanner with a pair of guiding devices, as illustrated in FIG. 5. A pair of parallel guiding devices 55a, 55b is located beneath the carriage 52. The driving device (not shown) can be implemented on one side of a guiding device 55a or 55b. The carriage 52 itself does not need any modification.

To sum up, the present invention can be adapted to various driving and guiding devices, including a single guiding device, or a pair of parallel guiding devices. The present invention can guarantee the document stay within the scene depth of the contact image sensor as long as the guiding devices can lift the carriage up in balance and allow the contact image sensor to contact tightly with the bottom surface side of the sheet table.

It should be understood that various alternatives to the structures described herein might be employed in practicing the present invention. It is intended that the following claims define the invention and that the structure within the scope of these claims and their equivalents be covered thereby.

What is claimed is:

1. A contact image sensor module having spring mountings comprising:

a contact image sensor module;

a carriage for loading said contact image sensor module; and a plurality of spring mountings each engaged to an end of said contact image sensor module in a manner that an ear-shaped spring steel plate is formed to rest on a side wall of said carriage.

2. The apparatus as claimed in claim 1, further comprising:

a plurality of sliding elements each attached onto the top surface side of said plurality of spring mountings.

3. The apparatus as claimed in claim 2, wherein said sliding elements are sliding blocks.

4. The apparatus as claimed in claim 2, wherein said sliding elements are spacers.

5. The apparatus as claimed in claim 1, wherein said plurality of spring mountings is made of spring steel.

6. The apparatus as claimed in claim 1, wherein said plurality of spring mountings has a horseshoe-shaped holder and an ear-shaped spring steel plate.

7. The apparatus as claimed in claim 1, wherein said plurality of spring mountings is engaged to said contact image sensor module with screws.

8. The apparatus as claimed in claim 1, wherein said carriage has slots at said side walls of said carriage for locating said plurality of spring mountings.

* * * * *